United States Patent [19]

Bartuska et al.

[11] Patent Number: 5,499,162

[45] Date of Patent: Mar. 12, 1996

[54] UNIVERSAL FRAME FOR DATA CARD

[75] Inventors: Jaroslav B. Bartuska, E. York, Canada; Richard J. Grimm, Shelburne, Vt.; Albert J. Kerklaan, Milton; David J. Saunders, Brampton, both of Canada; Jerzy M. Zalesinski, Essex Junction, Vt.

[73] Assignee: International Business Machines Corp., Armonk, N.Y.

[21] Appl. No.: 335,570

[22] Filed: Nov. 8, 1994

[51] Int. Cl.[6] .................................................. H05K 1/14
[52] U.S. Cl. ........................... 361/737; 361/741; 361/802; 439/44; 235/486
[58] Field of Search .................................. 361/737, 736, 361/752, 785, 741, 748, 796, 802; 439/44, 74; 174/260; 235/486, 492

[56] References Cited

U.S. PATENT DOCUMENTS

| 4,952,161 | 7/1990 | Komatsu | 439/155 |
| 5,207,586 | 5/1993 | MacGregor et al. | 439/76 |
| 5,296,692 | 3/1994 | Shino | 235/486 |
| 5,313,364 | 5/1994 | Omori et al. | 361/737 |
| 5,333,100 | 7/1994 | Anhalt et al. | 361/818 |
| 5,338,219 | 8/1994 | Hiramoto et al. | 439/350 |

OTHER PUBLICATIONS

IBM Technical Disclosure bulletin, vol. 37, No. 06A, Jun. 1994, pp. 605–606 Hermetic Personal Computer memory card International Association Plugg–able Card.

*Primary Examiner*—Leo P. Picard
*Assistant Examiner*—Y. Whang
*Attorney, Agent, or Firm*—Thornton & Thornton; William Skladoney

[57] ABSTRACT

This is a data card frame provided with a unique end rail which is bifurcated to form a receptacle port which can accept any number of different connector headers each of which is designed not only to mate with a selected external plug or terminal but is further uniquely designed to mate with a particular data card being supported in the frame. The receptacle port in the frame is also provided with locking detents coded to assure the correct positioning of the connector header in the receptacle port during insertion therein. The receptacle port is further provided with metal latching inserts matching locking hooks on a mating external plug that permit the external plug to be inserted into, with minimal force and securely latched thereto.

10 Claims, 3 Drawing Sheets

UNIVERSAL FRAME FOR DATA CARD

FIELD OF THE INVENTION

This invention relates generally to data cards commonly used with computers. More particularly, the invention relates to data cards that conform to Personal Computer Memory Card International Association (PCMCIA) requirements.

BACKGROUND OF THE INVENTION

Personal Computer Memory Card International Association (PCMCIA) cards are slightly larger than a personal credit card and are now widely known and used in the industry. They are used especially with portable personal devices, such as laptop computers, to permit the quick and easy expansion of the capabilities of such portable devices. These PCMCIA cards may be populated with any number and type of circuits including semiconductor modules and are adapted to be easily inserted into a suitable receptacle in, for example, a laptop computer to provide quick, simple and easy increases in capability, e.g. memory, or to act as an interface between the computer and another more specialized accessory circuit or device, e.g. a modem.

These PCMCIA data cards are typically formed of a plastic frame, for carrying a printed circuit board having any number of different modules, flatpacks, semiconductor chips, or other active or passive devices necessary to implement the function of the data card thereon. Metallic top and bottom covers are secured to the frame for providing electromagnetic shielding for the board and the electronic devices disposed on the printed circuit board. The printed circuit board has at one end thereof an integral plug designed for connection with the computer with which it is to be used.

When the card is to be used as an interface, it is necessary that an interface connector be provided on the other end of the card. These interface connectors have, in addition to solder points for connection to the printed circuit board, either pins or sockets as are necessary to mate with the accessory's connector plug. To provide the necessary strength and structural integrity requires to assure a good connection between the data card and the accessory's connector plug, the interface connectors of the prior art molded into the frame as an integral part thereof.

Because of the rapid advances in the semiconductor industry and because of demands for constant improvements to the data cards and accessories used therewith, it is necessary, with the prior art frames, when changes require the redesign of the interface connector, to discard all the frames which had molded therein the now no longer usable interface connector. This caused increased scrap and unnecessary expense.

Additionally, many of these cards are produced in short product runs. Thus, the logistics of obtaining the exact number of unique frames can be considerable and very expensive because of the small number of units required. Indeed many times, because the number of units required are few and the expense of designing the molded frames so high, undesirable compromises are made in the design to avoid the expense of a new frame.

SUMMARY OF THE INVENTION

Accordingly it is an object of the invention to provide a new, unique, and universal, interfacing data card frame which can be readily altered so as to be readily usable with any printed circuit board regardless of it design or redesign and to be useable with any desired accessory.

It is a further object of the invention to provide a universal frame which does not require re-tooling when the printed circuit, used therein, or the accessory to be used therewith changes.

It is another object of the invention to provide a data card frame which can be readily adapted to meet the sudden changes caused either by short production runs or changes in the product mix in the production line while assuring only the number frames actually needed are created and made available.

These and other objects are realized in the present invention which provides a data card frame provided with a unique interface connector receptacle port. This port is designed to accept any number of different interface connector headers so that the frame which can be readily adapted to meet changing requirements due to changes in either the card or the connector plug on the accessory to be coupled thereto. This is achieved by creating all the interface connector headers, regardless of the number, position or grouping of the pins or sockets therein with a universal body configuration adapted to fit into the receptacle port.

The unique receptacle port, of the present invention, is provided with locking detents coded to prevent the erroneous insertion of the interface connector headers therein.

The receptacle port, of the present invention, is further provided with metal latching inserts that mate with matching locking hooks on a mating connector plug, coupled to an accessory. These latching inserts are mounted in the frame such that they assure that the connecting plug is self-latching to the frame, and hence the accessory, cannot be accidentally detached from the interface connector header. Although the metal inserts assure such self-latching, they are designed to permit quick and easy disassembly of the connector plug and the accessory from the PCMCIA card. By self-latching it is meant that the plug can be inserted easily in the frame with minimum force and that the person inserting the plug need not move or position the latching hooks on the plug during the insertion.

The present invention by providing, in the data card frame, a receptacle port adapted for the insertion of a universal interface connector header not only eliminates the need for excess frames which ultimately are scrapped but achieves, in a single step, a means of assuring each and every frame is usable. Thus the scrapping of frames for this cause is avoided.

The present invention thus overcomes all the difficulties encountered with the prior art frames having the connector molded therein.

These and other objects and features of the present invention will become further apparent from the following description taken in conjunction with the drawings.

DESCRIPTION OF THE PREFERRED EMBODIMENT

Figure 1:
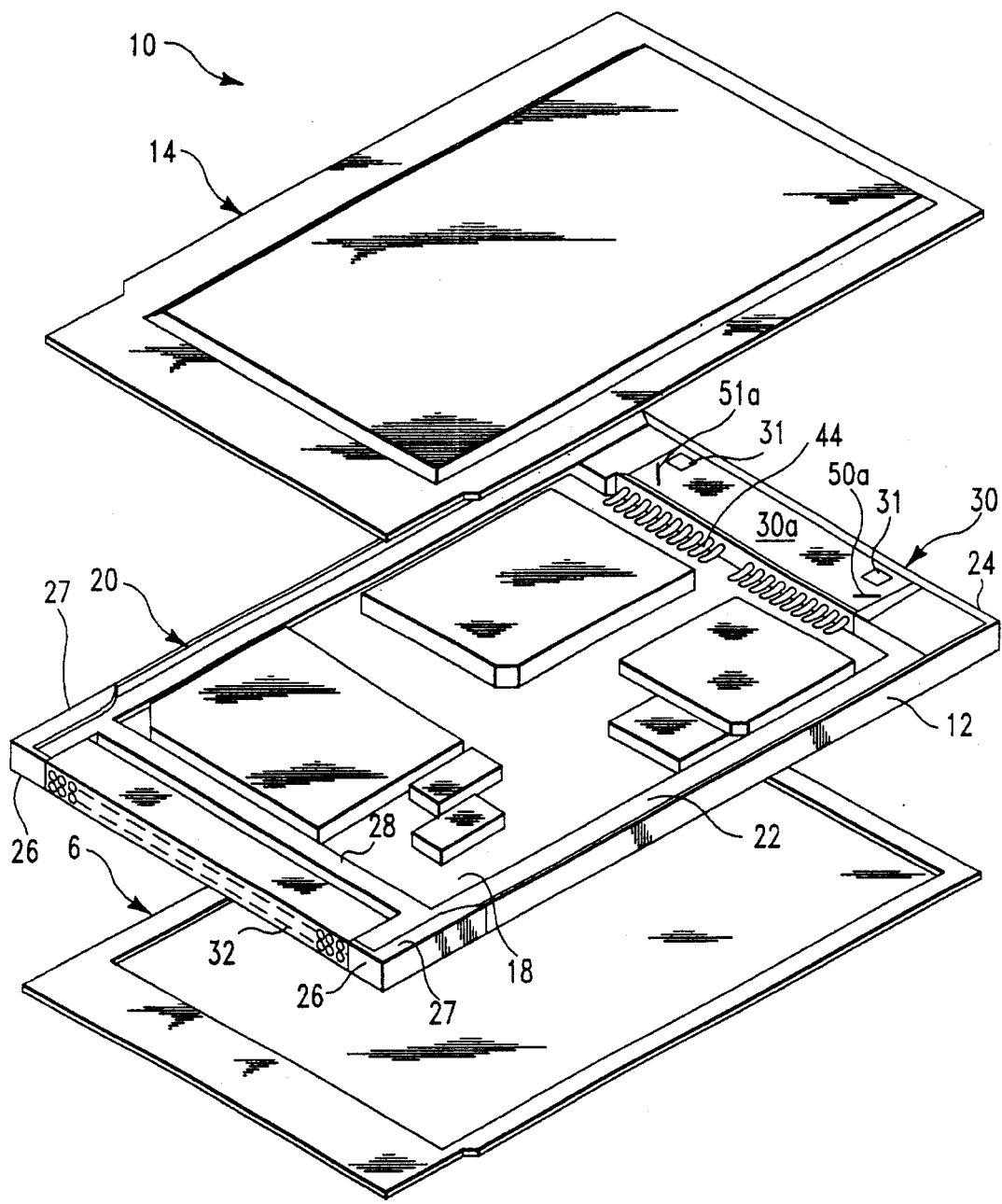
FIG. 1 is an exploded view of the PCMCIA data card of the present invention.
Figure 2:
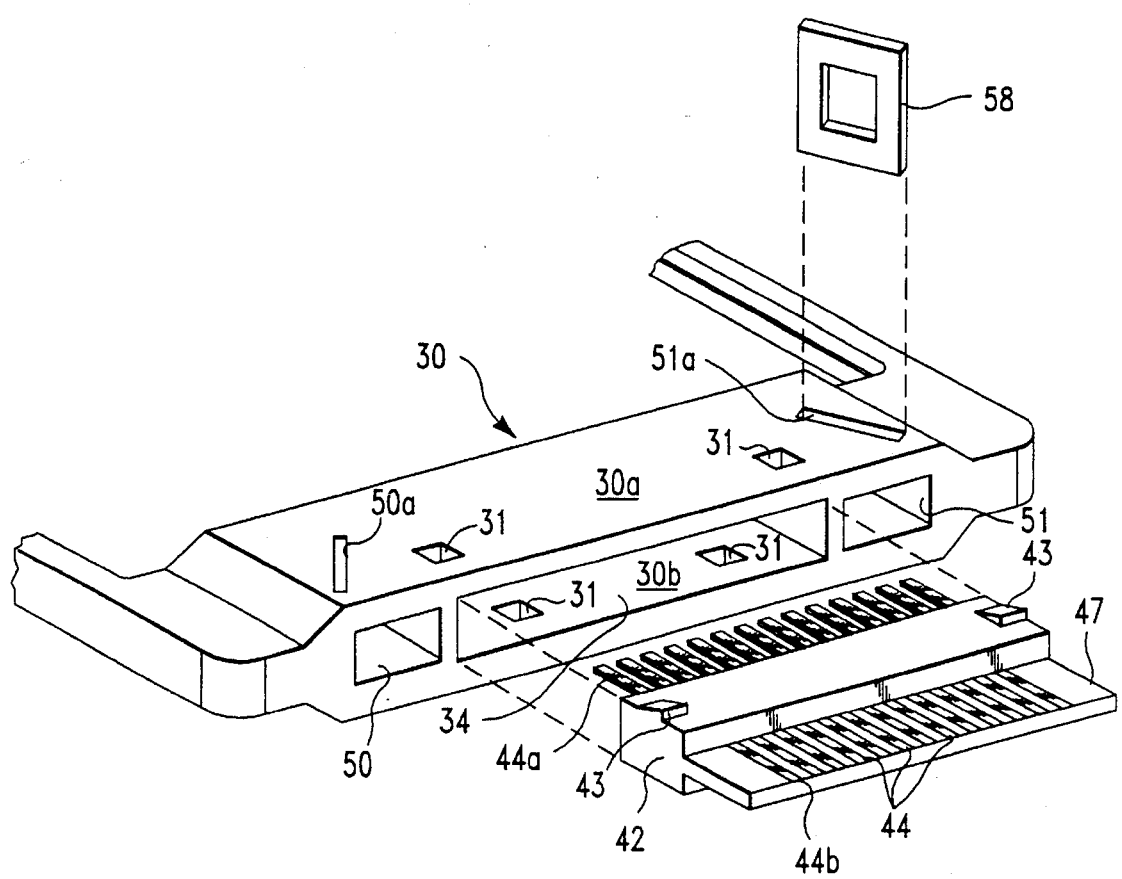
FIG. 2 is a greatly enlarged exploded partial view of the receptacle port of the present invention with a connector header and locking insert positioned for insertion therein.
Figure 3:
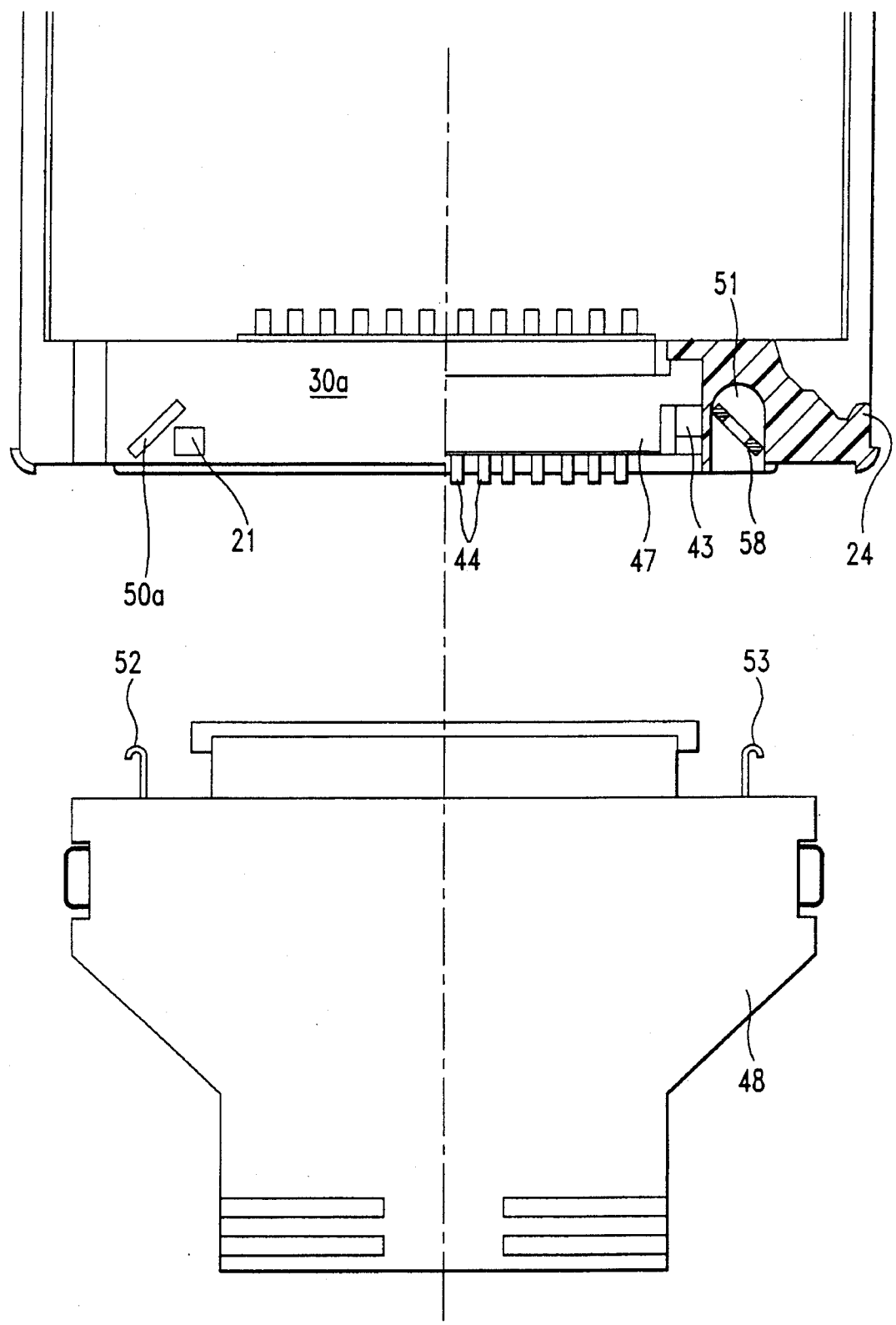
FIG. 3 is a top partial sectional view of a portion of the frame of the present invention with a mating cable connector positioned for coupling to the frame of the present invention.

The present invention will be described, in detail, in conjunction with FIGS. 1 to 3. Turning now to FIGS. 1 to 3 and especially FIG. 1 there is shown an exploded view of a PCMCIA data card 10 built in accordance with the present invention. The card includes a molded hollow plastic frame 12 to which top and bottom covers 14 and 16 can be affixed and into which a printed circuit board 18 can be placed.

The frame 12 comprises side rails 20 and 22, each of which has a distal end 24 and a proximal end 26 held in a parallel relationship by cross bars 28 and 30. Thus the frame 12 is basically a hollow rectangle. It should be noted that the cross bar 28 is positioned a small distance back from the proximal ends 26 of the rails 20 and 22 to provide a sufficient clearance for a standard, connector 32 for connecting the completed card with a device such as a laptop computer (not shown). This connector 32 is provided integral with one end et of the printed circuit board 18 and is formed to fit snugly between the portion of the proximal ends 26 of the rails 20 and 22 that extend beyond the cross bar 28 and to be locked therein by metal clips 27 on positioned on the proximal end of each of the rails 20 and 22.

At the other end of the frame, the cross bar 30 is, as shown in FIG. 2, bifurcated into upper and lower bars 30a and 30b to form therebetween a receptacle port 34 designed to accept an interfacing connector 42 that will mate with the printed circuit board 18. The interfacing connector 42 is typically formed with a plurality of pass through connecting leads 44. One end 44a of each lead 44 is connected, usually by soldering, to a respective Input/Output (I/O) point 46 on the printed circuit board 18. The other end 44b of each lead is adapted to interface with an external cable connector 48, as shown in FIG. 3, for coupling the completed PCMCIA card, via a suitable cable, to an accessory (not shown).

Although, in FIG. 2 the leads 44 are shown as metal strips laid down on a non-insulating, e.g., plastic support 47, it should be noted that the external portion 44b, connectable to the connector 48, can be in the form of male pins or female sockets or other conventional connectors.

In the prior art, the interfacing connector 42 was molded integral with the frames such that whenever a change was made in the circuitry of the board 18 that requires either more pins or a different arrangement of pins, it necessitated the scraping of the now unusable frames and the production of new frames to accommodate the changes. Additionally whenever the product mix on the production line temporarily changed it necessitated the collection of and temporary storage of the old frames and the delivery of new frames thus interfering with efficient production flow.

The present invention solves such problems through the simple expedient of forming the data card frame 10 with the unique receptacle port 34 above described. This port 34 is designed to accept any one of a number of connector headers thus assuring that the frame can quickly and easily be made usable with any printed circuit board to be inserted therein or with any cable connector. These headers can be quickly and easily substituted for whenever the printed circuit or cable design changes.

The bifurcated cross bar 30, forming the receptacle port 34 therebetween is further provided with detents 31 and matching locking tabs 43 on the interface connector body 42. These detents 31 and the matching tabs 43 are coded such that the interface connector header 42 can be inserted into the port 34 if it is in the proper orientation thus preventing the interface connector header from being inserted into the port 34 backwards or upside down.

Also in the bar 30, adjacent to and on either side of the port 34, there is further provided cavities 50 and 51 adapted to receive J-shaped clips 52 and 53 provided on the cable connector plug 48. Each of these cavities intersect a respective slot 50a and 51a passing through the top of the upper bar 30a and set at approximately 45 degrees with respect to the length of the end rail. Inserted in each slot and extending into each cavity are metal latches 58 generally in the form of a "D" or a hollow square. These latches 48 are arranged to interface with the hooks on the tips of the J-shaped clips on any cable connector being coupled to the interfacing connector 42.

The J hooks 53 on the cable connector 48 are provided with a spring action. By positioning the metal insert at an angle the metal insert permits the lower portion of the J hook to easily slide along it and causes the J or lower portion of the hook to deflect sufficiently to permit to pass through the opening in the insert. Once the lower portion passes through the opening in the insert, it springs back to its normal position and the lower portion of the hook goes behind the insert preventing its direct removal. By so permitting the hook on the end of the J-shaped clips to pass by these latches and then spring back, the plug, once properly inserted in the receptacle port 34, can not be accidentally dislodged or uncoupled. However by squeezing the J hooks the plug can be easily removed from the frame.

In this way the plug can be inserted easily in the frame with minimum force and that the person inserting the plug need not move or position the latching hooks on the plug during the insertion.

It should now be obvious to one skilled in the art that many modifications can be made to the present invention without departing therefrom. For example although the locking insert is shown in the figure as being a hollow square element, i.e. a D shape, it could be a pin or a sleeve thus obviating the necessity of providing a slot in the top of the bar 30.

Thus, while the invention has been particularly described with respect to a preferred embodiment and variations thereon, it should be understood that one skilled in the art can, from the foregoing, readily make further changes in form and detail without departing from the spirit and scope of the invention.

What is claimed is:

1. A data card frame comprising:

a frame for mounting a printed circuit card therein;

said frame including a generally hollow receptacle port for the insertion of a removable interfacing connector header therein;

said header being provided with pass through terminal means having a first end connectable to said printed circuit board mounted in said frame and a second end adapted to mate with an external connector plug therein;

said header being further provided with locating means; and said port being further provided with means for interfacing with said locating means on said header to selectively locate said header in said port.

2. A data card frame comprising:

a frame having a pair of opposite side rails, and opposite end rails arranged 90 degrees to said side rails;

the first one of said end rails including means for securing a printed circuit board between said side rails; and the other of said end rails including a bifurcated region forming a receptacle port adapted for the insertion of an interfacing connector header therein.

3. The data card frame of claim 2 wherein:

said connector header is provided with pass through terminal means.

4. The data card frame of claim 2 wherein:

said connector pass through terminal means have a first end connectable to a printed circuit board secured in said frame and a second end adapted to mate with an external connector plug.

5. The data card of claim 4 wherein said cavities are adjacent said bifurcated region and provided with metal latching means therein.

6. The data card of claim 5 wherein said metal latching means are flat plates in the form of a hollow square.

7. The data card of claim 6 wherein said flat plates are positioned a approximately 45 degrees with respect to the length of said other end rail.

8. The data card of claim 2 wherein said other end rail is further provided with cavities therein for receiving locking hooks provided on said cable connector.

9. A PCMCIA data card comprising:

a hollow rectangular frame, molded of plastic material, having a pair of opposing side rails, and a pair of opposing end rails arranged 90 degrees to said side rails;

said end rails maintaining each said side rails in a spaced parallel fixed relationship;

one of said end rails including metal clip means for securing a printed circuit board between said side rails;

the other of said end rails including a bifurcated region forming a receptacle port adapted for the insertion of an interfacing connector header, a connector header, provided with pass through terminal means connectable to a printed circuit board, secured in said frame, and to an external connector plug, cavities positioned in said other end rail on either side of said bifurcated region; and said cavities having metal latching member therein.

10. A data card frame comprising:

a frame molded of plastic material having a pair of opposite side rails, opposite and opposite end rails arranged 90 degrees to said side rails;

one of said end rails including means for securing a printed circuit board between said side rails; and the other of said end rails including a bifurcated region forming a receptacle port adapted for the insertion of a universal connector body, said connector being provided with pass through terminal means connectable to said printed circuit board and to an external connector.

* * * * *